US006181751B1

(12) United States Patent
Sun

(10) Patent No.: US 6,181,751 B1
(45) Date of Patent: Jan. 30, 2001

(54) MULTI-STAGE DETECTION SYSTEM IN DIGITAL DEMODULATOR

(75) Inventor: Weimin Sun, Toyko (JP)

(73) Assignee: NEC Corporation, Tokyo (JP)

( * ) Notice: Under 35 U.S.C. 154(b), the term of this patent shall be extended for 0 days.

(21) Appl. No.: 08/953,929

(22) Filed: Oct. 20, 1997

(30) Foreign Application Priority Data

Oct. 22, 1996 (JP) .................................................. 8-279425

(51) Int. Cl.$^7$ .............................. H03D 1/00; H04L 27/06
(52) U.S. Cl. .......................................... 375/340; 375/325
(58) Field of Search .................................... 375/340, 316, 375/324, 325, 326, 349, 377, 330, 333, 329, 331, 332, 225, 283, 281; 329/304, 305, 310

(56) References Cited

U.S. PATENT DOCUMENTS

| | | | |
|---|---|---|---|
| 4,007,330 | * | 2/1977 | Flanagan ................................ 375/330 |
| 4,007,331 | * | 2/1977 | Flanagan ................................ 375/330 |
| 5,323,424 | * | 6/1994 | Fazel et al. . |
| 5,550,506 | * | 8/1996 | Tsumura ................................ 329/304 |

FOREIGN PATENT DOCUMENTS

| | | |
|---|---|---|
| 4-108740 | 4/1992 | (JP) . |
| 7-336406 | 12/1995 | (JP) . |
| WO9429990 | 12/1994 | (WO) . |

OTHER PUBLICATIONS

Y. Matsumoto, S. Kubota and S. Kato, "A New Burst Coherent Demodulator for Microcellular TDMA/TDD Systems", IEICE Trans. Commun. vol. E77–B, No. 7, pp. 927–933, Jul., 1994.

C. Liu and K. Feher, "Proposed π/4–QPSK with Increased Capacity in Digital Cellular Systems", ICC '92, pp. 316–318, 1992.
H. Tomita, Y. Yokoyama, T. Matsuki, "Digital Intermediate Frequency Demodulation Technique for Cellular Communication Systems", IEEE GLOBECOM '90, San Diego, Ca, pp. 1827–1831, Dec. 1990.
D. Divsalar and M. Simon, "Multiple–Symbol Differential Detection of MPSK", IEEE Trans. Commun, vol. 38, No. 3, pp. 300–308, Mar. 1990.
Japanese Office Action received May 26, 1999 in corresponding Japanese Application.
English translation of selected portion of May 26, 1999 Japanese Office Action.

* cited by examiner

Primary Examiner—Chi H. Pham
Assistant Examiner—Jean B. Corrielus
(74) Attorney, Agent, or Firm—Ostrolenk, Faber, Gerb & Soffen, LLP

(57) ABSTRACT

A multi-stage detection system in a digital modulator includes a first-stage detector, a second-stage detector, and a third-stage detector. The first-stage detector detects an input signal. The second-stage detector receives the outputs from the first-stage detector. The third-stage detector receives the outputs from the second-stage detector. The first-stage detector includes first to third delays, first to third adders, and first to third detectors. The first delay delays the input signal by one sampling period. The first adder adds the input signal to the output from the first delay. The first detector detects the output from the first adder. The second delay delays the output from the first delay by one sampling period. The second adder adds the input signal to the output from the second delay. The second detector detects an output from the second adder. The third delay delays the output from the second delay by one sampling period. The third adder adds the input signal to the output from the third delay. The third detector detects the output from the third adder.

9 Claims, 4 Drawing Sheets

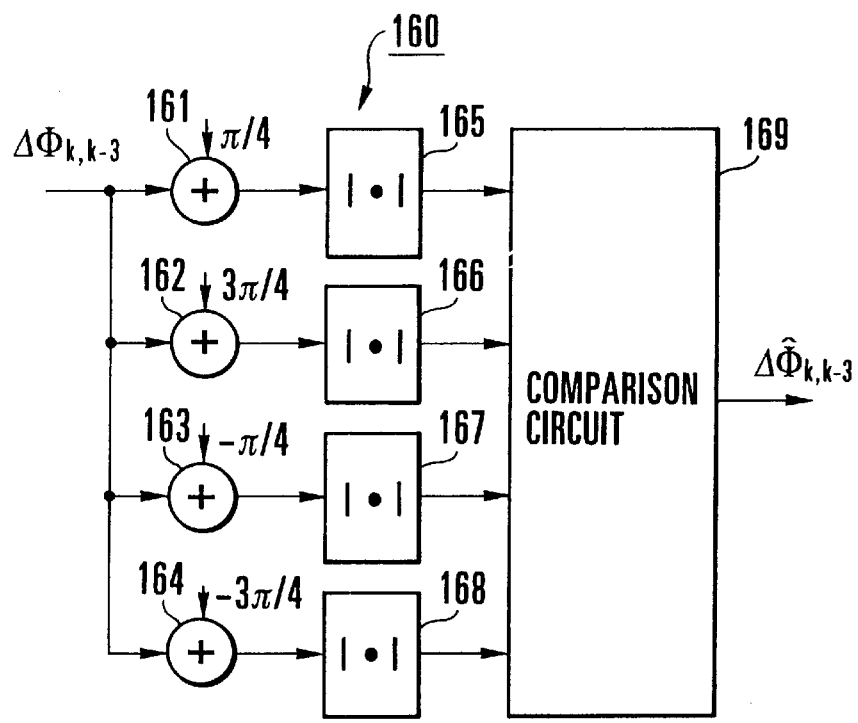
F I G. 5
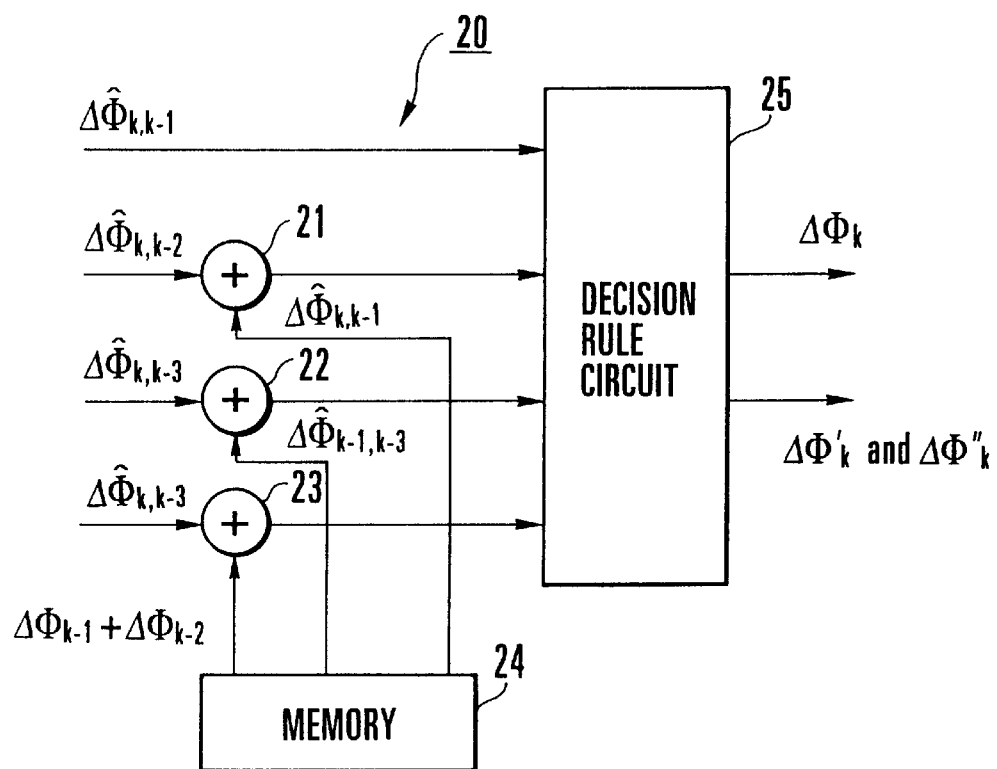
F I G. 6

MULTI-STAGE DETECTION SYSTEM IN DIGITAL DEMODULATOR

BACKGROUND OF THE INVENTION

The present invention relates to a multi-stage detection system in a digital demodulator for demodulating a received signal by differential detection.

Digital demodulators are widely used in the telecommunication field. A digital modulator which demodulates a received signal by differential detection can be efficiently used in a mobile communication system. The signal to be received by the digital demodulator is transmitted as a transmitted signal from a transmitter. For example, this transmitted signal is produced by differential phase shift keying in the transmitter. That is, the transmitted signal has phase information.

The coherent detection methods obtain the phase information by reproducing the carrier frequency and phase correctly (see, for example, Y. Matsumoto, S. Kubota and S. Kato, "A New Burst Coherent Demodulator for Microcellular TDMA/TDD Systems", IEICE Trans. Commun. Vol. E77-B, No. 7, pp. 927–933, July, 1994). If the carrier frequency and phase can be reproduced correctly, the demodulation characteristics are superior to that of the other kind of demodulators. However, it is complicated to realize the carrier synchronization and since the modulated signal is always transmitted under a fading environment in mobile communication, it is also quite difficult to reproduce the carrier frequency and phase exactly.

The conventional differential detection methods calculate the phase difference between the two adjacent symbols of the received signal (see, for example, C. Liu and K. Feher, "Proposed π/4-QPSK with Increased Capacity in Digital Cellular Systems", ICC'92, pp. 316–318, 1992, and H. Tomita, Y. Yokoyama, T. Matsuki, "DIGITAL INTERMEDIATE FREQUENCY DEMODULATION TECHNIQUE FOR CELLULAR COMMUNICATION SYSTEMS", IEEE GLOBECOM'90, San Diego, Calif., pp. 1827–1831, December 1990), and a decision rule is used to obtain the transmitted information. Although the differential detection methods are effective under the fading environment, the static characteristics are inferior to those of the coherent detector.

The multiple-symbol method uses more than two symbols for improving the static characteristics of the above differential detectors (see, for example, D. Divsalar and M. Simon, "Multiple-Symbol Differential Detection of MPSK", IEEE Trans. Commun. Vol. 38, No. 3, pp. 300–308, March 1990). However, it becomes very complicated to realize the multiple-symbols detector.

SUMMARY OF THE INVENTION

It is an object of the present invention to provide a multi-stage detection system in a digital modulator which has almost the same static characteristics as the multiple-symbols method and can be realized easily.

It is another object of the present invention to provide a multi-stage detection system in a digital modulator which has a fading characteristic at least as good as that of the conventional differential detector.

In order to achieve the above objects, according to the present invention, there is provided a multi-stage detection system in a digital modulator, comprising first-stage detection means for detecting an input signal, second-stage detection means for receiving outputs from the first-stage detection means, and third-stage detection means for receiving outputs from the second-stage detection means, the first-stage detection means including a first delay for delaying the input signal by one sampling period, a first adder for adding the input signal to an output from the first delay, a first detector for detecting an output from the first adder, a second delay for delaying the output from the first delay by one sampling period, a second adder for adding the input signal to an output from the second delay, a second detector for detecting an output from the second adder, a third delay for delaying the output from the second delay by one sampling period, a third adder for adding the input signal to an output from the third delay, and a third detector for detecting an output from the third adder.

BRIEF DESCRIPTION OF THE DRAWINGS

FIG. 5 is a block diagram showing a detector C in FIG. 2;

FIG. 6 is a block diagram showing a second-stage detector in FIG. 1; and

DESCRIPTION OF THE PREFERRED EMBODIMENT

Figure 1:
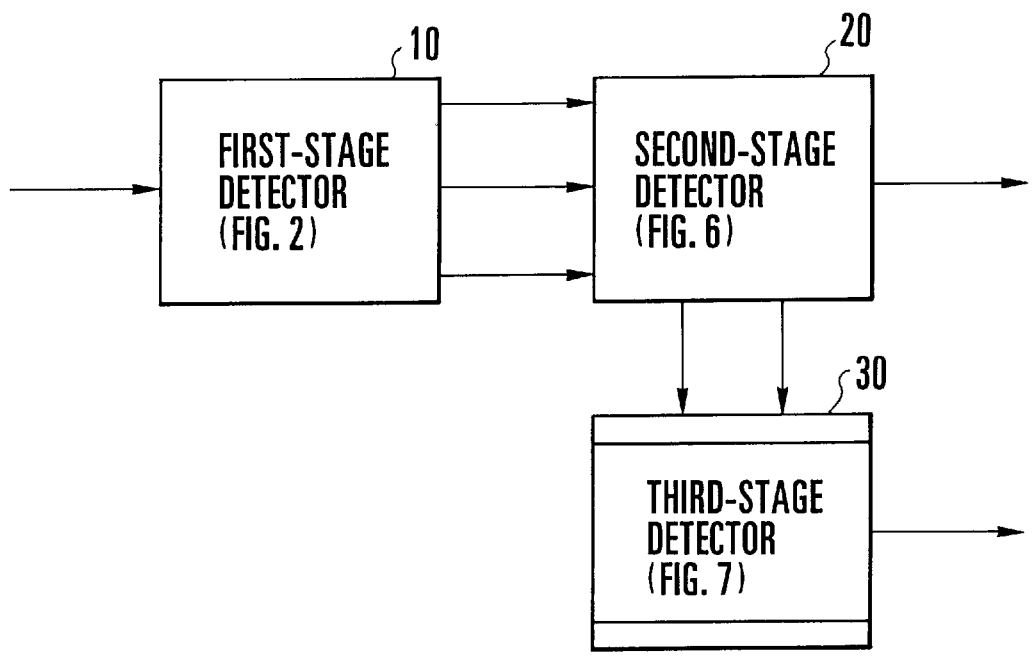
FIG. 1 is a block diagram showing a digital demodulator according to an embodiment of the present invention.

The principle of the present invention will be described first with reference to the reference numerals in the accompanying drawings.

According to the present invention, a digital demodulator includes a first-stage detection means (first-stage detector 10), a second-stage detection means (second-stage detector 20), and a third-stage detection means (third-stage detector 30). The first-stage detection means (first-stage detector 10) has a first delay means (detectors A 120, B 140, and C 160) which receives an input signal indicating the phase information of a received signal and generates first to third delay signals by delaying the input signal. The delay time of each delay signal is equal to one sampling period. Letting $\Phi_k$ be the input signal, the respective delay signals are expressed as $\Phi_{k-1}$, $\Phi_{k-2}$, and $\Phi_{k-3}$. The phase differences between $\Phi_k$, $\Phi_{k-1}$, $\Phi_{k-2}$, and $\Phi_{k-3}$ are calculated by a first addition means (adders 114 to 116) in the following manner.

$$\Delta\Phi_{k,k-1} = \Phi_k - \Phi_{k-1}$$

$$\Delta\Phi_{k,k-2} = \Phi_k - \Phi_{k-2}$$

$$\Delta\Phi_{k,k-3} = \Phi_k - \Phi_{k-3}$$

A first detection means (detectors A 120, B 140, and C 160) is used to supply the estimates of the above values. The first detection means (detectors A 120, B 140, and C 160) includes a second addition means (adders 121 to 124, 141 to 144, and 161 to 164), an absolute value calculation means (absolute circuits 125 to 128, 145 to 149, and 165 to 168) for obtaining phase errors, and a first comparison means (comparators 129, 150, and 169).

The first comparison means (comparators 129, 150, and 169) is used to detect the minimum values of $$\{\epsilon_{k,k-1}^{(1)}, \epsilon_{k,k-1}^{(2)}, \epsilon_{k,k-1}^{(3)}, \epsilon_{k,k-1}^{(4)}\}$$

$\{\epsilon_{k,k-2}^{(1)}, \epsilon_{k,k-2}^{(2)}, \epsilon_{k,k-2}^{(3)}, \epsilon_{k,k-2}^{(4)}\}$ $\{\epsilon_{k,k-3}^{(1)}, \epsilon_{k,k-3}^{(2)}, \epsilon_{k,k-3}^{(3)}, \epsilon_{k,k-3}^{(4)}\}$ according to equations (9) to (21) given below. The estimates of $\Delta\Phi_{k, k-1}$, $\Delta\Phi_{k, k-2}$, and $\Delta\Phi_{k, k-3}$ are obtained according to equations (22) to (24) given below.

$$\varepsilon_{k,k-1}^{(1)} = \left|\Delta\Phi_{k,k-1} - \frac{\pi}{4}\right| \tag{9}$$

$$\varepsilon_{k,k-1}^{(2)} = \left|\Delta\Phi_{k,k-1} - \frac{3\pi}{4}\right| \tag{10}$$

$$\varepsilon_{k,k-1}^{(3)} = \left|\Delta\Phi_{k,k-1} + \frac{\pi}{4}\right| \tag{11}$$

$$\varepsilon_{k,k-1}^{(4)} = \left|\Delta\Phi_{k,k-1} + \frac{3\pi}{4}\right| \tag{12}$$

$$\varepsilon_{k,k-2}^{(1)} = \left|\Delta\Phi_{k,k-2} - \frac{\pi}{2}\right| \tag{13}$$

$$\varepsilon_{k,k-2}^{(2)} = \left|\Delta\Phi_{k,k-2} + \frac{\pi}{2}\right| \tag{14}$$

$$\varepsilon_{k,k-2}^{(3)} = |\Delta\Phi_{k,k-2} - \pi| \tag{15}$$

$$\varepsilon_{k,k-2}^{(4)} = |\Delta\Phi_{k,k-2} + \pi| \tag{16}$$

$$\varepsilon_{k,k-2}^{(5)} = |\Delta\Phi_{k,k-2} - 0| \tag{17}$$

$$\varepsilon_{k,k-3}^{(1)} = \left|\Delta\Phi_{k,k-3} - \frac{\pi}{4}\right| \tag{18}$$

$$\varepsilon_{k,k-3}^{(2)} = \left|\Delta\Phi_{k,k-3} - \frac{3\pi}{4}\right| \tag{19}$$

$$\varepsilon_{k,k-3}^{(3)} = \left|\Delta\Phi_{k,k-3} + \frac{\pi}{4}\right| \tag{20}$$

$$\varepsilon_{k,k-3}^{(4)} = \left|\Delta\Phi_{k,k-3} - \frac{3\pi}{4}\right| \tag{21}$$

$$\Delta\Phi_{k,k-1} = \Delta\Phi' \tag{22}$$

$$\Delta\Phi_{k,k-2} = \Delta\Phi'' \tag{23}$$

$$\Delta\Phi_{k,k-3} = \Delta\Phi''' \tag{24}$$

Note that $\Delta\Phi'$ is one unknown of $\{\pm\pi/4, \pm 3\pi/4\}$, $\Delta\Phi''$ is one unknown of $\{0, \pm\pi/2, \pm\pi\}$, and $\Delta\Phi'''$ is one unknown of $\{\pm\pi/4, \pm 3\pi/4\}$. If, for example, $\epsilon_{k, k-1}^{(3)}$, $\epsilon_{k, k-2}^{(1)}$, and $\epsilon_{k, k-3}^{(2)}$ are the maximum values, equations (25) to (27) given below are obtained:

$$\Delta\Phi_{k,k-1} = -\frac{\pi}{4} \tag{25}$$

$$\Delta\Phi_{k,k-2} = \pi \tag{26}$$

$$\Delta\Phi_{k,k-3} = \frac{3\pi}{4} \tag{27}$$

The second-stage detection means (second-stage detector 20) includes a third-stage addition means (adders 21 to 23), and obtains the estimates of $\Delta\Phi_{k, k-1}$ by using the above estimates and the previous detection result according to equations (28) to (31) given below:

$$\Delta\Phi_k^{(1)} = \Delta\Phi_{k,k-1} \tag{28}$$

$$\Delta\Phi_k^{(2)} = \Delta\Phi_{k,k-2} - \Delta\Phi_{k,k-1} \tag{29}$$

$$\Delta\Phi_k^{(3)} = \Delta\Phi_{k,k-3} - \Delta\Phi_{k-1,k-3} \tag{30}$$

$$\Delta\Phi_k^{(4)} = \Delta\Phi_{k,k-3} - \Delta\Phi_{k-1} - \Delta\Phi_{k-2} \tag{31}$$

The decision rule is described as follows.

The estimates of $\Delta\Phi_k^{(i)}$ (i=1, 2, 3, 4) are the same, $\Phi_k$ which has the same value as these estimates is output as the detection result of the multi-stage detector; otherwise where two estimates are the same, and the remaining two estimates are the same, two different estimates $\Delta\Phi'_k$ and $\Delta\Phi''_k$ are supplied to the third-stage detection means (third-stage detector 30).

This decision rule is realized by a second comparison means (decision rule circuit 25) of the second-stage detection means (second-stage detector 20).

The third-stage detection means (third-stage detector 30) includes a fourth addition means (adders 303 to 325) and a second absolute value calculation means (absolute circuits 326 to 337) for performing calculations based on equations (1) to (8).

$$\varepsilon'^{(1)}_{k,k-2} = \left|\Delta\Phi_{k,k-2} - \frac{\pi}{4} - \Delta\Phi'_k\right| + \left|\Delta\Phi_{k-1,k-2} - \frac{\pi}{4}\right| \tag{1}$$

$$\varepsilon'^{(2)}_{k,k-2} = \left|\Delta\Phi_{k,k-2} - \frac{3\pi}{4} - \Delta\Phi'_k\right| + \left|\Delta\Phi_{k-1,k-2} - \frac{3\pi}{4}\right| \tag{2}$$

$$\varepsilon'^{(3)}_{k,k-2} = \left|\Delta\Phi_{k,k-2} + \frac{\pi}{4} - \Delta\Phi'_k\right| + \left|\Delta\Phi_{k-1,k-2} + \frac{\pi}{4}\right| \tag{3}$$

$$\varepsilon'^{(4)}_{k,k-2} = \left|\Delta\Phi_{k,k-2} - \frac{3\pi}{4} - \Delta\Phi'_k\right| + \left|\Delta\Phi_{k-1,k-2} + \frac{3\pi}{4}\right| \tag{4}$$

$$\varepsilon'^{(5)}_{k,k-2} = \left|\Delta\Phi_{k,k-2} - \frac{\pi}{4} - \Delta\Phi''_k\right| + \left|\Delta\Phi_{k-1,k-2} - \frac{\pi}{4}\right| \tag{5}$$

$$\varepsilon'^{(6)}_{k,k-2} = \left|\Delta\Phi_{k,k-2} - \frac{3\pi}{4} - \Delta\Phi''_k\right| + \left|\Delta\Phi_{k-1,k-2} - \frac{3\pi}{4}\right| \tag{6}$$

$$\varepsilon'^{(7)}_{k,k-2} = \left|\Delta\Phi_{k,k-2} + \frac{\pi}{4} - \Delta\Phi''_k\right| + \left|\Delta\Phi_{k-1,k-2} + \frac{\pi}{4}\right| \tag{7}$$

$$\varepsilon'^{(8)}_{k,k-2} = \left|\Delta\Phi_{k,k-2} + \frac{3\pi}{4} - \Delta\Phi''_k\right| + \left|\Delta\Phi_{k-1,k-2} + \frac{3\pi}{4}\right| \tag{8}$$

Note that $\Delta\Phi_{k-1, k-2} = \Phi_{k-1} - \Phi_{k-2}$. The third-stage detection means (third-stage detector 30) further includes a third comparison means for detecting the minimum value from the above errors calculated based on equations (1) to (8), $\epsilon'_{k, k-2}^{(i)}$ (i=1, . . . , 8), and outputting corresponding $\Delta\Phi'_k$ or $\Delta\Phi''_k$ as the output from the multi-stage detector. If, for example, $\epsilon'_{k, k-2}^{(4)}$ is the minimum value, $\Delta\Phi_k = \Delta\Phi'_k$ is established.

FIG. 1 shows a multi-stage detection system according to the first embodiment of the present invention which is based on the above principle. This multi-stage detection system includes the first-stage detector 10, the second-stage detector 20, and the third-stage detector 30. Referring to FIG. 1, an input signal $\Phi_k$ represents the phase information of a received signal. The outputs from the first-stage detector 10 are the estimates of the phase differences between two symbols, three symbols, and four symbols. These estimates are given by equations (22) to (24) given above.

These outputs from the first-stage detector 10 are input to the second-stage detector 20. The outputs from the second-stage detector 20 are a combination of $\Delta\Phi_k$ or $\Delta\Phi'_k$ and $\Delta\Phi''_k$.

$\Delta\Phi'_k$ and $\Delta\Phi''_k$ output from the second-stage detector 20 are input to the third-stage detector 30. The third-stage detector 30 then outputs $\Delta\Phi'_k$ or $\Delta\Phi''_k$.

Figure 2:
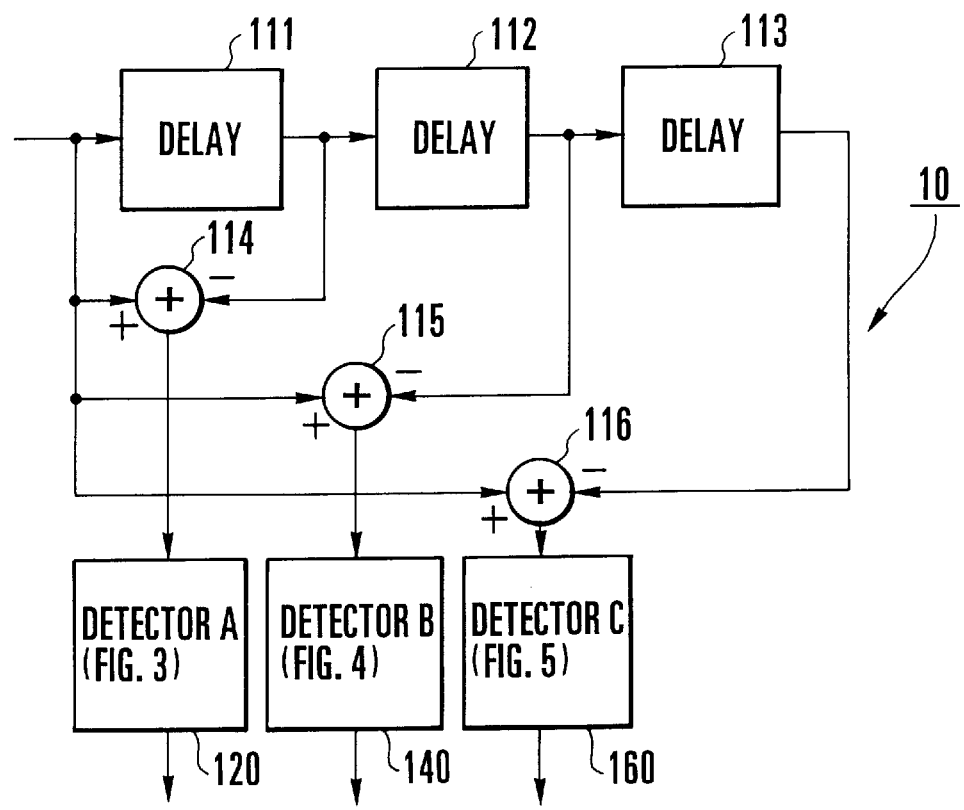
FIG. 2 is a block diagram showing a first-stage detector in FIG. 1.

FIG. 2 shows the first-stage detector 10 in FIG. 1. The first-stage detector 10 includes delays 111, 112, and 113 for respectively delaying the input signal $\Phi_k$ by one sampling period to output $\Delta\Phi_{k-1}$, $\Delta\Phi_{k-2}$, and $\Delta\Phi_{k-3}$, and the adders 114 to 116 for obtaining the phase differences given by the following equations:

$\Delta\Phi_{k,k-1} = \Phi_k - \Phi_{k-1}$ $\Delta\Phi_{k,k-2} = \Phi_k - \Phi_{k-2}$ $\Delta\Phi_{k,k-3} = \Phi_k - \Phi_{k-3}$ The first-stage detector 10 further includes the detectors (A 120, B 140, and C 160) which respectively receive the outputs from the adders 114 to 116.

Figure 3:
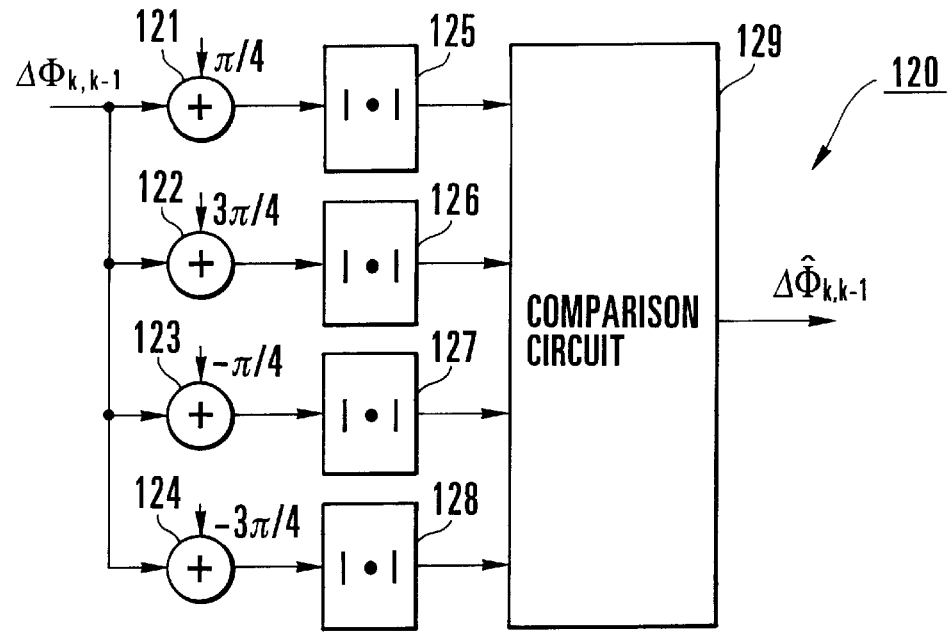
FIG. 3 is a block diagram showing a detector A in FIG. 2.

FIG. 3 shows the detector A 120. This detector A 120 includes the adders 121, 122, 123, and 124 and the absolute circuits 125, 126, 127, and 128 for respectively calculating phase errors according to equations (9) to (12) given above.

The detector A 120 also includes the comparator 129 for detecting the minimum value of $\epsilon_{k,k-1}^{(i)}$ (i=1, 2, 3, 4) and providing the corresponding output. If, for example, $\epsilon_{k,k-1}^{(3)}$ is the minimum value, equation (25) given above is obtained.

Figure 4:
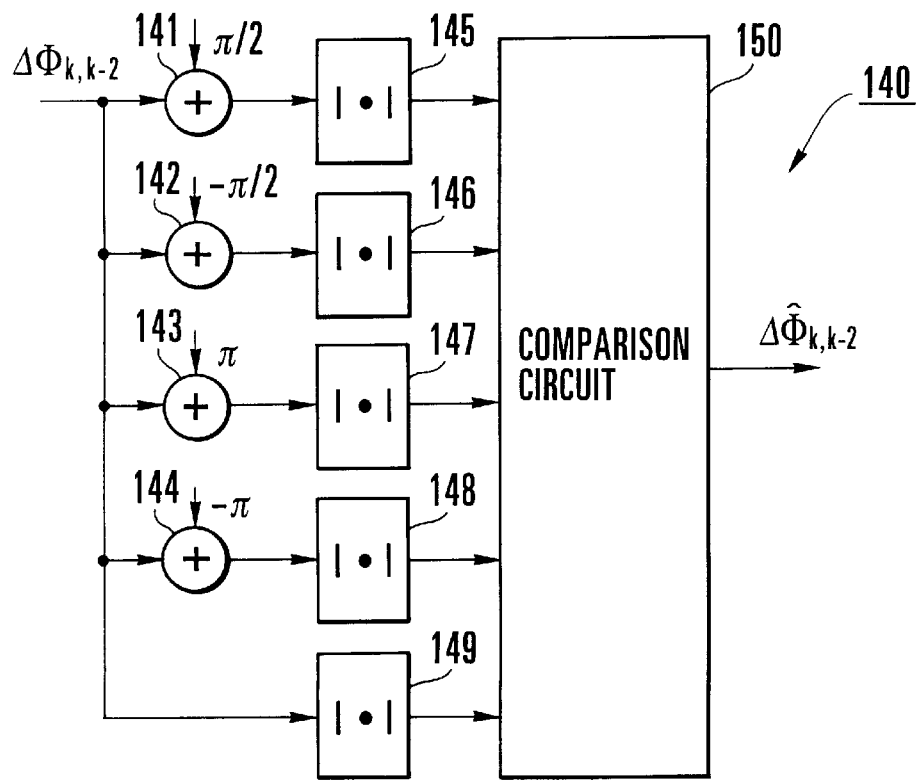
FIG. 4 is a block diagram showing a detector B in FIG. 2.

FIG. 4 shows the detector B 140. This detector B 140 includes the adders 141, 142, 143, and 144 and the absolute circuits 145, 146, 147, 148, and 149 for respectively calculating phase errors according to equations (13) to (17) given above.

The detector B 140 also includes the comparator 150 for detecting the minimum value of $\epsilon_{k,k-2}^{(i)}$ (i=1, 2, 3, 4) and providing the corresponding output. If, for example, $\epsilon_{k,k-2}^{(1)}$ is the minimum value, equation (26) given above is obtained.

FIG. 5 shows the detector C 160. This detector C 160 includes the adders 161, 162, 163, and 164 and the absolute circuits 165, 166, 167, and 168 for respectively calculating phase errors according to equations (19) to (21) given above.

The detector C 160 also includes the comparator 169 for detecting the minimum value of $\epsilon_{k,k-3}^{(i)}$ (i=1, 2, 3, 4) and providing the corresponding output. If, for example, $\epsilon_{k,k-3}^{(2)}$ is the minimum value, equation (27) given above is obtained.

FIG. 6 shows the second-stage detector 20 in FIG. 1. This second-stage detector 20 includes the adders 21, 22, and 23 for calculating equations (28) to (31) given above, and the decision rule circuit 25 for receiving the outputs from the adders 21 to 23 and the detector A 120.

In this case, the estimates of $\Delta\Phi_{1-1}$, $\Delta\Phi_{k-2}$, and $\Delta\Phi_{k-1,k-3}$ are stored in a memory 24. If four or more estimates of $\Delta\Phi_k^{(i)}$ (i=1, 2, 3, 4) are the same, the decision rule circuit 25 outputs $\Delta\Phi_k$ which has the same value as these estimates as the detection result of the multi-stage detector; otherwise, the two different estimates $\Delta\Phi'_k$ and $\Delta\Phi''_k$ are supplied to the third-stage detector 30.

Figure 7:
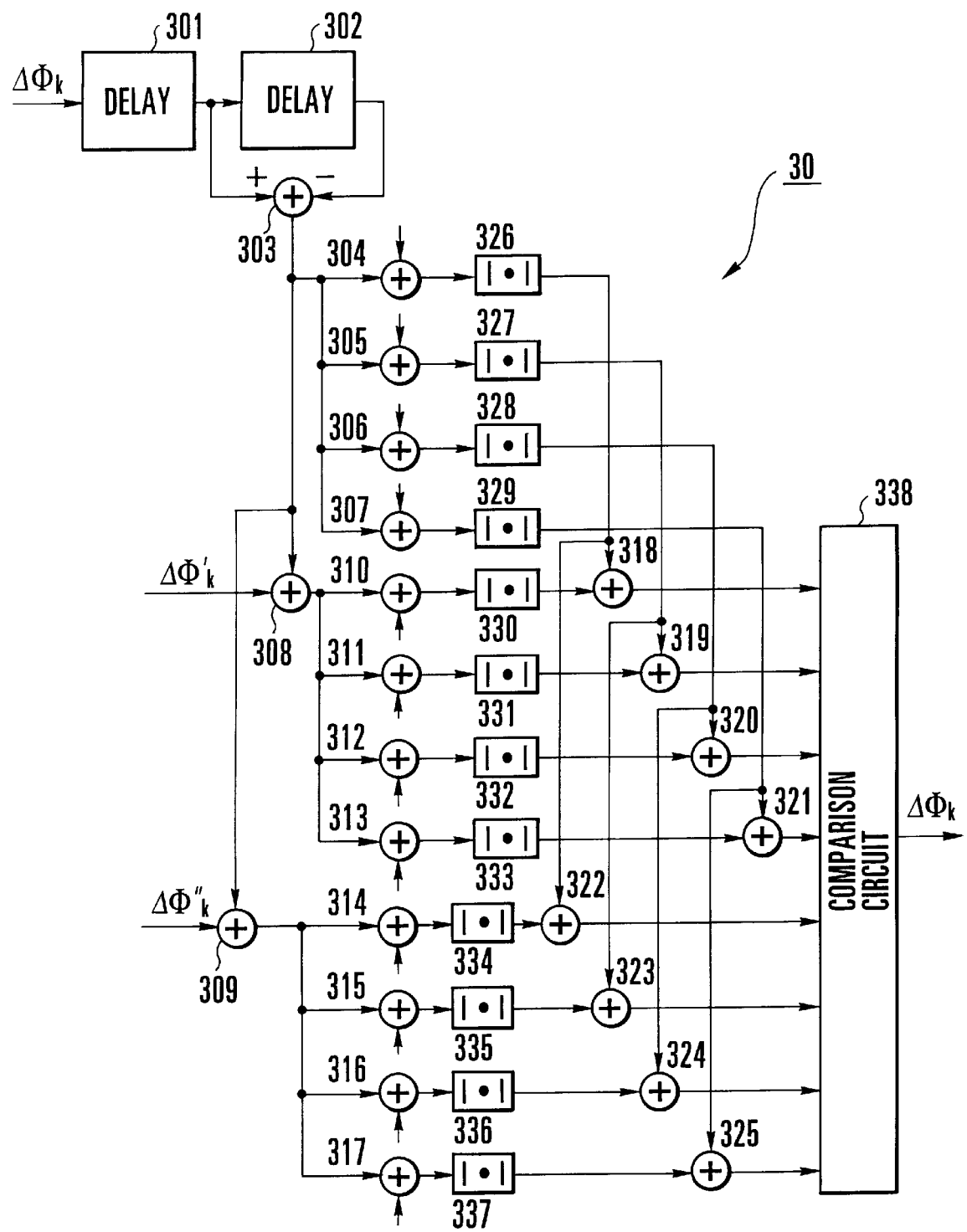
FIG. 7 is a block diagram showing a third-stage detector in FIG. 1.

FIG. 7 shows the third-stage detector 30 in FIG. 1. This third-stage detector 30 includes delays 301 and 302, the adders 303 to 325, the absolute circuits 326 to 337, and a comparison circuit 338 for obtaining the minimum value according to equations (1) to (8) given above, and outputting corresponding $\Delta\Phi_k$ and $\Delta\Phi'_k$ as the output from the multi-stage detector. Note that the delays 301 and 302 correspond to the delays 111 and 112.

As has been described above, according to the present invention, there is provided a digital modulator which has almost the same static characteristics as the multiple-symbols method and can be realized easily. In addition, a fading characteristic at least as good as that of the conventional differential detector can be provided.

What is claimed is:

1. A multi-stage detection system in a digital demodulator, comprising:

first-stage detection means for detecting an input signal;
second-stage detection means for receiving outputs from said first-stage detection means; and
third-stage detection means for receiving outputs from said second-stage detection means,
said first-stage detection means including:
a first delay for delaying the input signal by one sampling period;
a first adder for adding the input signal to an output from said first delay;
a first detector for detecting an output from said first adder, said first detector comprising:
a fourth adder for adding the output from said first adder to a constant $\pi/4$;
a fifth adder for adding the output from said first adder to a constant $3\pi/4$;
a sixth adder for adding the output from said first adder to a constant $-\pi/4$;
a seventh adder for adding the output from said first adder to a constant $-3\pi/4$;
a first absolute circuit for calculating a phase error of an output from said fourth adder;
a second absolute circuit for calculating a phase error of an output from said fifth adder;
a third absolute circuit for calculating a phase error of an output from said sixth adder;
a fourth absolute circuit for calculating a phase error of an output from said seventh adder; and
a comparison circuit for comparing outputs from said first to fourth absolute circuits;
a second delay for delaying the output from said first delay by one sampling period;
a second adder for adding the input signal to an output from said second delay;
a second detector for detecting an output from said second adder;
a third delay for delaying the output from said second delay by one sampling period;
a third adder for adding the input signal to an output from said third delay; and
a third detector for detecting an output from said third adder.

2. A system according to claim 1, wherein said comparison circuit selects a minimum value from the outputs from said first to fourth absolute circuits, and outputs a corresponding constant of $\pm\pi/4$ and $\pm3\pi/4$.

3. A multi-stage detection system in a digital demodulator, comprising:

first-stage detection means for detecting an input signal;
second-stage detection means for receiving outputs from said first-stage detection means;
and third-stage detection means for receiving outputs from said second-stage detection means,
said first-stage detection means including:
a first delay for delaying the input signal by one sampling period;
a first adder for adding the input signal to an output from said first delay;
a first detector for detecting an output from said first adder;
a second delay for delaying the output from said first delay by one sampling period;
a second adder for adding the input signal to an output from said second delay;
a second detector for detecting an output from said second adder, said second detector comprising:
a fourth adder for adding the output from said second adder to a constant $\pi/2$;
a fifth adder for adding the output from said second adder to a constant $-\pi/2$;

a sixth adder for adding the output from said second adder to a constant $\pi$;

a seventh adder for adding the output from said second adder to a constant $-\pi$;

a first absolute circuit for calculating a phase error of an output from said fourth adder;

a second absolute circuit for calculating a phase error of an output from said fifth adder;

a third absolute circuit for calculating a phase error of an output from said sixth adder;

a fourth absolute circuit for calculating a phase error of an output from said seventh adder;

a fifth absolute circuit for calculating a phase error of an output from said second adder; and a comparison circuit for comparing outputs from said first to fifth absolute circuits;

a third delay for delaying the output from said second delay by one sampling period;

a third adder for adding the input signal to an output from said third delay; and a third detector for detecting an output from said third adder.

4. A system to claim 3, wherein said comparison circuit selects a minimum value from the outputs from said first to fifth absolute circuits, and outputs a corresponding contant of $\pi/2$, $-\pi/2$, $\pi$, $-\pi$ and 0.

5. A multi-stage detection system in a digital demodulator, comprising:

first-stage detection means for detecting an input signal;

second-stage detection means for receiving outputs from said first-stage detection means; and third-stage detection means for receiving outputs from said second-stage detection means, said first-stage detection means including:
a first delay for delaying the input signal by one sampling period;

a first adder for adding the input signal to an output from said first delay;

a first detector for detecting an output from said first adder;

a second delay for delaying the output from said first delay by one sampling period;

a second adder for adding the input signal to an output from said second delay;

a second detector for detecting an output from said second adder;

a third delay for delaying the output from said second delay by one sampling period;

a third adder for adding the input signal to an output from said third delay; and a third detector for detecting an output from said third adder said third detector comprising:

a fourth adder for adding the output from said third adder to a constant $\pi/4$;

a fifth adder for adding the output from said third adder to a constant $3\pi/4$;

a sixth adder for adding the output from said third adder to a constant $-\pi/4$;

a seventh adder for adding the output from said third adder to a constant $-3\pi/4$;

a first absolute circuit for calculating a phase error of an output from said fourth adder;

a second absolute circuit for calculating a phase error of an output from said fifth adder;

a third absolute circuit for calculating a phase error of an output from said sixth adder;

a fourth absolute circuit for calculating a phase error of an output from said seventh adder; and a comparison circuit for comparing outputs from said first to fourth absolute circuits.

6. A system according to claim 5, wherein said comparison circuit selects a minimum value from the output from said first to fourth absolute circuits, and output a corresponding constant of $\pm\pi/4$ and $\pm3\pi/4$.

7. A multi-stage detection system in a digital demodulator, comprising:

first-stage detection means for detecting an input signal;

second-stage detection means for receiving outputs from said first-stage detection means; and third-stage detection means for receiving outputs from said second-stage detection means, said first-stage detection means including:
a first delay for delaying the input signal by one sampling period;

a first adder for adding the input signal to an output from said first delay;

a first detector for detecting an output from said first adder;

a second delay for delaying the output from said first delay by one sampling period;

a second adder for adding the input signal to an output from said second delay;

a second detector for detecting an output from said second adder;

a third delay for delaying the output from said second delay by one sampling period;

a third adder for adding the input signal to an output from said third delay; and a third detector for detecting an output from said third adder said second-stage detection means including:
a memory for storing a detection result and an estimate;

a fourth adder for adding the output from said second detector to the detection result stored in said memory;

a fifth adder for adding the output from said third detector to the estimate stored in said memory;

a sixth adder for adding the output from said third detector to the detection result stored in said memory; and a decision rule circuit for receiving the output from said first detector of said first detection means and outputs from said fourth to sixth adders as first, second, third and fourth input signals, respectively, and deciding a multi-stage detection output in accordance with said first, second, third and fourth input signals.

8. A system according to claim 7, wherein said decision rule circuit compares said first, second, third and fourth inputs, and outputs said multi-stage detection output according to a decision rule, said decision rule being defined as:

if said first, second, third and fourth input signals to said decision rule circuit are the same, select any one of said first, second, third or fourth input signals as said multi-stage detection output, and if two of said first, second, third and fourth input signals to said decision rule circuit are the same, and two other of said first, second, third and fourth input signals are the said multi-stage output comprises two estimates based on two different of said first, second, third and fourth input signals.

9. A system according to claim 8, wherein said third-stage detection means comprises:

a seventh adder for adding the outputs from said first and second delays together;

an eighth adder for adding one of the estimates from said decision rule circuit to an output from said seventh adder;

a ninth adder for adding the other estimate from said decision rule circuit to the output from said seventh adder;

a 10th adder for adding an output from said eighth adder to a constant π/4;

an 11th adder for adding an output from said eighth adder to a constant 3π/4;

a 12th adder for adding an output from said eighth adder to a constant −π/4;

a 13th adder for adding an output from said eighth adder to a constant −3π/4;

a 14th adder for adding an output from said ninth adder to a constant π/4;

a 15th adder for adding an output from said ninth adder to a constant 3π/4;

a 16th adder for adding an output from said ninth adder to a constant −π/4;

an 17th adder for adding an output from said ninth adder to a constant −3π/4;

18th to 21st adders for adding the output from said seventh adder to constants π/4, −π/4, 3π/4 and −3π/4, respectively;

1st to 12th absolute circuits for respectively obtaining absolute values of outputs from said 10th to 21st adders; and a comparison circuit coupled to said first to twelfth absolute circuits for obtaining a minimum value using equations $$\varepsilon'_{k,k-2}{}^{(1)} = \left|\Delta\Phi_{k,k-2} - \frac{\pi}{4} - \Delta\Phi'_k\right| + \left|\Delta\Phi_{k-1,k-2} - \frac{\pi}{4}\right|,$$

$$\varepsilon'_{k,k-2}{}^{(2)} = \left|\Delta\Phi_{k,k-2} - \frac{3\pi}{4} - \Delta\Phi'_k\right| + \left|\Delta\Phi_{k-1,k-2} - \frac{3\pi}{4}\right|,$$

$$\varepsilon'_{k,k-2}{}^{(3)} = \left|\Delta\Phi_{k,k-2} + \frac{\pi}{4} - \Delta\Phi'_k\right| + \left|\Delta\Phi_{k-1,k-2} + \frac{\pi}{4}\right|,$$

$$\varepsilon'_{k,k-2}{}^{(4)} = \left|\Delta\Phi_{k,k-2} - \frac{3\pi}{4} - \Delta\Phi'_k\right| + \left|\Delta\Phi_{k-1,k-2} + \frac{3\pi}{4}\right|,$$

$$\varepsilon'_{k,k-2}{}^{(5)} = \left|\Delta\Phi_{k,k-2} - \frac{\pi}{4} - \Delta\Phi''_k\right| + \left|\Delta\Phi_{k-1,k-2} - \frac{\pi}{4}\right|,$$

$$\varepsilon'_{k,k-2}{}^{(6)} = \left|\Delta\Phi_{k,k-2} - \frac{3\pi}{4} - \Delta\Phi''_k\right| + \left|\Delta\Phi_{k-1,k-2} - \frac{3\pi}{4}\right|,$$

$$\varepsilon'_{k,k-2}{}^{(7)} = \left|\Delta\Phi_{k,k-2} + \frac{\pi}{4} - \Delta\Phi''_k\right| + \left|\Delta\Phi_{k-1,k-2} + \frac{\pi}{4}\right|,$$

$$\varepsilon'_{k,k-2}{}^{(8)} = \left|\Delta\Phi_{k,k-2} + \frac{3\pi}{4} - \Delta\Phi''_k\right| + \left|\Delta\Phi_{k-1,k-2} + \frac{3\pi}{4}\right|,$$

where ε' is an error value, Φ is an input signal representing phase information and k is an integer value corresponding to a sampling period, and setting $\Delta\Phi'_k$ or $\Delta\Phi''_k$ as a detection output.

* * * * *